United States Patent [19]

Fraser

[11] 4,400,867
[45] Aug. 30, 1983

[54] HIGH CONDUCTIVITY METALLIZATION FOR SEMICONDUCTOR INTEGRATED CIRCUITS

[75] Inventor: David B. Fraser, Berkeley Heights, N.J.

[73] Assignee: Bell Telephone Laboratories, Incorporated, Murray Hill, N.J.

[21] Appl. No.: 372,177

[22] Filed: Apr. 26, 1982

[51] Int. Cl.³ .......................................... H01L 21/285
[52] U.S. Cl. ...................................... 29/571; 29/578; 29/591; 148/187
[58] Field of Search ......................... 29/571, 578, 591; 148/187, 188

[56] References Cited

U.S. PATENT DOCUMENTS

| | | | |
|---|---|---|---|
| 3,777,364 | 12/1973 | Schinella et al. | 29/578 |
| 3,865,624 | 2/1975 | Wilde | 117/212 |
| 3,967,981 | 7/1976 | Yamazaki | 148/187 X |
| 4,102,733 | 7/1978 | De La Moneda et al. | 29/571 X |
| 4,180,596 | 12/1979 | Crowder et al. | 29/591 X |
| 4,182,023 | 1/1980 | Cohen et al. | 29/571 |
| 4,305,760 | 12/1981 | Trudel | 29/571 X |
| 4,319,395 | 3/1982 | Lund et al. | 29/571 |
| 4,332,839 | 6/1982 | Levinstein et al. | 427/85 |
| 4,364,166 | 12/1982 | Crowder et al. | 144/187 X |
| 4,373,251 | 2/1983 | Wilting | 148/187 X |

Primary Examiner—G. Ozaki
Attorney, Agent, or Firm—David I. Caplan

[57] ABSTRACT

A method for simultaneously patterning-over field oxide, gate oxide, and sidewall oxide—high conductivity metal-silicide electrode metallization for semiconductor integrated circuits involves (1) formation of an unpatterned polycrystalline silicon (polysilicon) layer everywhere on the exposed surface of all the oxides, (2) formation of a patterned photoresist layer on the polysilicon layer, (3) deposition of a layer of the metal-silicide over all exposed surfaces, (4) removal of the patterned photoresist layer to lift off metal-silicide, and (5) oxidation of only exposed portions of the polysilicon layer to form silicon dioxide. The polysilicon layer can be originally doped, so that the doped silicon dioxide can then be removed (without removing undoped silicon dioxide) by means of an etchant which attacks the dopant.

16 Claims, 8 Drawing Figures

HIGH CONDUCTIVITY METALLIZATION FOR SEMICONDUCTOR INTEGRATED CIRCUITS

FIELD OF THE INVENTION

This invention relates to semiconductor integrated circuits, and more particularly to methods for metallizing them.

BACKGROUND OF THE INVENTION

A semiconductor integrated circuit typically includes metallized interconnection electrodes in a pattern which overlies regions of both relatively thick and thin insulating layers. Typically a thick insulating layer region comprises a relatively thick layer of silicon dioxide, called "field oxide," located on a major planar surface of the silicon body in which the circuit is integrated; whereas a thin insulating layer region typically comprises a relatively thin silicon dioxide layer, called "gate oxide," located on the same major planar surface of the silicon body in regions complementary to the thick insulating layer regions (field oxide regions). Insulated gate field effect transistors are located in these regions of gate oxide. At the boundary between the thick and thin insulating regions a step is formed having an oxide sidewall surface (stemming from the field oxide) over which the metallized interconnection electrode must go.

A typical such situation, somewhat simplified for purposes of clarity only, is illustrated in FIG. 1. (The broken lines 4—4 and 5—5 are useful in defining typical cross sections.) Here a top view in perspective shows a monocrystalline silicon body 10; a thin central gate oxide layer 11; a thick oxide layer having a left-hand field oxide portion 12 and a right-hand field oxide portion 13; a first step 14 located at the boundary of the left-hand field oxide portion 13 with the gate oxide layer 11; a second step 15 located at the boundary of the gate oxide 11 with the right-hand portion 13; a first electrode 17 running along a path extending from the left-hand field oxide portion 12 to a termination at a point overlying the central gate oxide layer 11; and a second electrode 16 running along a path extending from the left-hand field oxide 12 to the right-hand field oxide 15. Thus the first electrode 16 crosses over both steps 14 and 15, whereas the second electrode 17 crosses over only the first step 14, for illustrative purposes only. For illustrative purposes, the first electrode 16 can be a gate electrode metallization which interconnects in two directions, and the second electrode 17 can be a gate electrode which interconnects in but one direction.

When these electrodes 16 and 17 are fabricated by conventional deposition of metal silicide on polycrystalline silicon followed by selective masking and etching, there is an undesirable tendency for the electrodes 16 and 17 to be joined (shorted) together by a residual metal strip running along the bottom of the sidewall of the step, because of the tendency of the etching not te remove completely some portions of the electrodes at the step. It would therefore be desirable to have a method for fabricating interconnection which avoids this problem.

SUMMARY OF THE INVENTION

This invention involves a method for simultaneously patterning--over relative thick field insulating regions, relatively thin gate insulating regions, and sidewall insulating regions at step boundaries therebetween--metal silicide metallization electrodes for semiconductor integrated circuits including the steps of: (1) forming an unpatterned polysilicon layer on said field, gate, and sidewall insulating regions, (2) forming a patterned resist layer on the polysilicon layer, (3) depositing the metal silicide over on said photoresist layer and on exposed portions of all the insulating regions, (4) removing the patterned resist layer to lift off the metal silicide thereon, and (5) oxidizing exposed portions of polysilicon to form silicon dioxide. In this manner, the metal silicide metallization is patterned, without substantial danger of short-circuits, simultaneously on both the thick insulating and thin insulating regions as well as on the sidewalls of steps at the boundaries therebetween.

BRIEF DESCRIPTION OF THE DRAWING

This invention may be better understood from the following detailed description when read in conjunction with the drawing in which.

Only for the sake of clarity, none of the Figures is to any scale.

DETAILED DESCRIPTION

Figure 1:
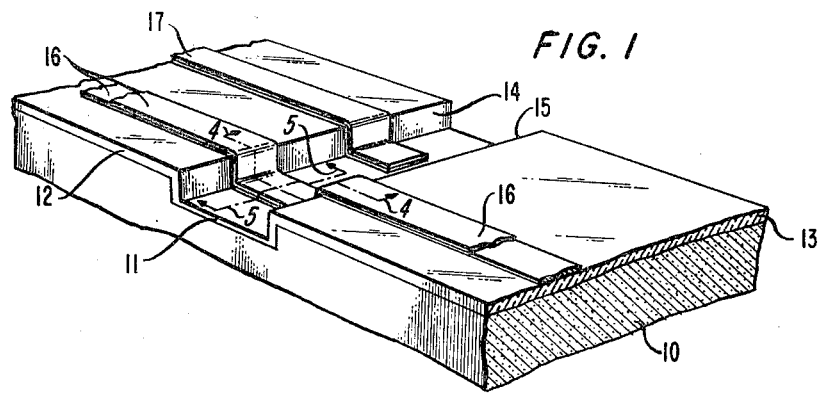
FIG. 1 is a top view in perspective of a semiconductor integrated circuit portion in order to illustrate the problem of the prior art.
Figure 2:
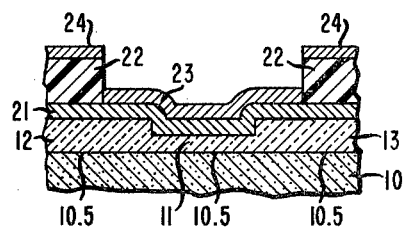
FIGS. 2–5 illustrate in cross sections various stages of fabrication of a semiconductor integrated circuit in accordance with a specific embodiment of the invention.
Figure 3:
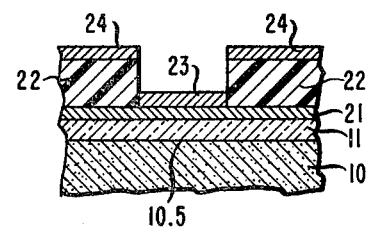
Figure 4:
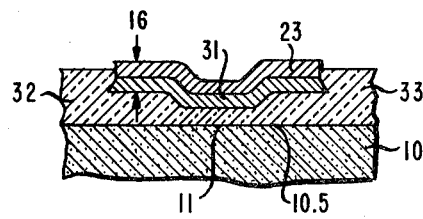
Figure 5:
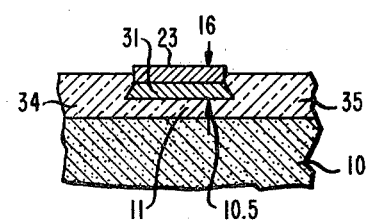

FIGS. 4 and 5 show the cross sections 4—4 and 5—5, respectively, of the structure to be fabricated (FIG. 1); whereas FIGS. 2 and 3 show the corresponding cross sections thereof, respectively, in an early stage of fabrication of the gate electrodes 16 and 17, according to a specific embodiment of the invention. Many similar such electrodes are to be formed, as gate electrode to different transistors of the insulated gate type. Here, in FIGS. 2 and 3, the top major surface 10.5 of the silicon body 10 is coated with the left-hand field oxide layer 12, gate oxide layer 11, and right-hand field oxide layer 13. The field oxide layers are typically in the approximate range of 2000 to 7000 Å thick, illustratively about 3500 Å thick; the gate oxide layer, typically in the approximate range of 70 to 500 Å thick, illustratively about 250 Å thick. A layer 21 of polycrystalline silicon (polysilicon), typically about 500 Å thick, is deposited all over these oxide layers, as by conventional chemical vapor deposition or plasma deposition. Because of the conformal (good step-coverage) property of polysilicon, the thickness of this polysilicon layer 21 is substantially uniform. A conventional resist layer 22 is formed, in a pattern corresponding to the desired ultimate metallization pattern, on the exposed surface of the polysilicon layer 21. This layer 22 is typically a photoresist layer, as known in the art. More specifically, this photoresist layer 21 is formed in a pattern over both field and gate oxides corresponding to the complement of the desired metallization pattern.

Then tantalum disilicide is formed as a silicide layer 23, for metallization purposes, over the exposed portions of the polysilicon layer 21; and also a tantalum disilicide layer 24 is simultaneously formed on the exposed top surface of the photoresist layer 22. For example, the silicide layer 23 can be formed by deposition by sputtering tantalum and silicon by conventional techniques, typically to a thickness in the approximate range of 1000 to 4000 Å, illustratively about 2500 Å. This sputtering can be performed with a single target of tantalum silicide or with separate targets (cosputtering) of tantalum and silicon.

Next the photoresist layer 22 is removed, as by a conventional etching solution, thereby lifting off the tantalum disilicide layer 24 but leaving intact the tantalum disilicide layer 23 on the polysilicon layer 21.

Then a conventional dry thermal oxidation treatment, typically at about 900° C. for about 30 minutes in oxygen ambient, oxidizes the exposed portion of the polysilicon layer to silicon dioxide (but does not appreciably oxidize the metal silicide), thereby bringing the structure being fabricated into the condition illustrated in FIGS. 4 and 5, representing the same cross sections as FIGS. 2 and 3, respectively. Here the polysilicon layer will be characterized by sloping edges, that is, a recessed structure of greater width at the bottom of the polysilicon layer than at the top, owing to the isotropic tendency of the oxidation process in polysilicon. Here also (FIGS. 4 and 5), field oxide layers 32 and 33 are thickened at their respective edges, due to the oxidation of polysilicon into silicon dioxide; and the remaining polysilicon forms a polysilicon layer 31 of consequently smaller lateral extent overlaid everywhere by the tantalum silicide layer 23. The polysilicon layer 31 plus the tantalum silicide layer 23 form the desired electrodes 16 and 17 (FIG. 1).

Because of the thermal oxidation of the exposed polysilicon, there is little danger of shorts between other similar gate electrodes and their interconnections, especially those proximate to electrodes 16 and 17, which are all simultaneously formed by remaining portions of the polysilicon layer (not shown) overlaid by the tantalum silicide layer.

As an added alternative, the polysilicon layer 21 (FIGS. 2 and 3) can be doped, preferably when being deposited (in situ doping) with donor impurities (in silicon) such as phosphorus. Accordingly, those (top) portions of the silicon dioxide layers 32, 33, 34, and 35 which grew out of the polysilicon will be doped oxide. In such a case, the structure being fabricated, in the condition shown in FIGS. 4 and 5, can be subjected to treatment with an etching solution which preferentially attacks the doped oxide more rapidly (typically by a factor of 2) than the undoped oxide. For example, a solution of buffered HF (30 parts by volume NH$_4$F, 1 part HF) which preferentially attacks phosphorus doped oxide can be used for this purpose. Accordingly the structure being fabricated is brought into the condition illustrated in FIGS. 6 and 7 in which the phosphorus-doped portions of silicon dioxide have been removed, thereby bringing the remaining silicon dioxide layer 11,12,13 more nearly in the configuration as originally deposited (before the added silicon dioxide stemming from oxidation of the polysilicon layer 21).

Figure 6:
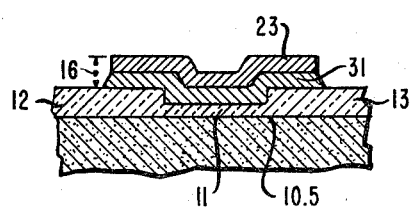
FIGS. 6–7 illustrate a cross section a later stage of fabrication of a semiconductor integrated circuit in accordance with another specific embodiment of the invention.
Figure 7:
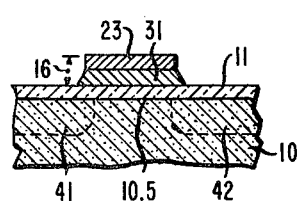

The structure shown in FIGS. 6 and 7 can also be achieved without doping the polysilicon. For example, instead of using solution etching with buffered HF, etching of the top portions of the silicon dioxide layers 32, 33, 34, and 35 to the extent necessary to bring the structure into the condition shown in FIGS. 6 and 7 can be achieved by reactive sputter etching with CHF$_3$.

The electrode structure formed by the combined polysilicon layer 31 and tantalum silicide layer 23 overlying gate oxide regions, as shown in FIG. 7, is characterized by a sloping sidewall of the polysilicon layer 31; that is, the width of the polysilicon layer 31 at its interface with the underlying gate oxide layer 11 is greater than its width at its interface with the overlying tantalum silicide layer 23. Accordingly, the edge of the polysilicon layer 31 can be advantageously used as a protective mask for defining the self-aligned edge of a source zone 41 and a drain zone 42 by subsequent conventional impurity introduction into the underlying silicon body 10 followed by thermal diffusion of the impurity therein.

Figure 8:
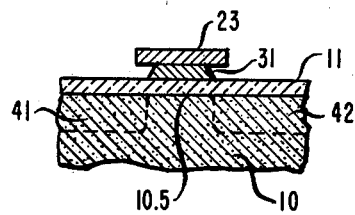
FIG. 8 illustrates in cross section a later stage of fabrication of a semiconductor integrated circuit in accordance with yet another specific embodiment of the invention.

By previously oxidizing the polysilicon layer 21 for a time longer than required to convert some of its regions not underlying the silicide into silicon dioxide, the resulting polysilicon layer 31 will have a recess (FIG. 8) cut into it by the extra time of oxidation. In this manner, as indicated in FIG. 8, the silicide layer 23 will overhang the resulting polysilicon layer 31, so that the edge of the metal silicide layer 23 serves as a selfalignment protective mask against introduction of impurities. Thus, by controlling a subsequent thermal diffusion time for the impurities, the edges of the source and drain zones 41 and 42 can be made more nearly aligned with the edges of the polysilicon layer 31, as is desired for reducing overlap capacitance.

Another advantageous feature of the resulting gate electrode is that the combined overall height of the electrode can be lower (because of the lower electrical resistivity of metal silicide than of polysilicon) than in other procedures using thicker polysilicon layers for reduced electrical resistance; thereby, further reduction of undesired mutual parasitic capacitance of neighboring electrode edge surfaces can be achieved.

Although the invention has been described in detail with respect to specific embodiments, various modifications can be made without departing from the scope of the invention. For example, instead of tantalum, other silicide-forming metals can be used, such as cobalt, or titanium. The resist layer 21 can also be an electron beam resist or an X-ray resist layer, as known in the art. Finally the electrode metallization technique of this invention can similarly be used for metallizing gate, source, or drain of Schottky barrier gate, source, or drain transistors.

What is claimed is:

1. A method for simultaneously patterning high conductivity metal silicide electrode metallization overlying field oxide, gate oxide, and sidewall oxide, for semiconductor integrated circuits including the steps of:
   (a) forming an unpatterned polysilicon layer everywhere simultaneously on exposed top surfaces of said field oxide, and gate oxide, and said sidewall oxide;
   (b) forming a patterned resist layer on the polysilicon layer;
   (c) depositing a layer of the metal silicide over then exposed portions of the top surfaces of said resist layer and of said unpatterned polysilicon layer;
   (d) removing the patterned resist layer to lift off metal silicide thereon, leaving intact a correspondingly patterned layer of said metal silicide on said polysilicon layer; and (e) oxidizing exposed portions of the polysilicon layer to form an exposed layer of silicon dioxide whereby a correspondingly patterned polysilicon layer remains underlying said patterned layer of metal silicide.

2. The method of claim 1 in which said unpatterned polysilicon layer is doped with an impurity dopant, whereby said exposed layer of silicon dioxide is a doped oxide layer.

3. The method of claim 2 which further comprises the step of treating said doped oxide layer with an etchant which preferentially attacks said doped oxide layer, whereby said doped oxide layer is removed leaving substantially intact said field oxide, said gate oxide, said sidewall oxide, and said metal silicide.

4. The method of claim 3 further comprising the step of introducing and diffusing impurities to form source and drain zones in the silicon body in regions thereof underlying said gate oxide, using said patterned layer of polysilicon as a self-alignment protective mask against the introduction of said impurities.

5. The method of claim 2, 3, or 4 in which said impurity dopant is phosphorus.

6. The method of claim 5 in which said etchant is essentially buffered HF.

7. A method of forming a semiconductor integrated circuit comprising the step of forming an unpatterned layer of polysilicon overlying an oxide layer, said oxide layer having thick and thin portions thereof with sidewall portions therebetween, and said oxide layer forming a coating over a major surface of a semiconductor body, followed by the step of applying on said layer a patterned protective mask against oxidation of said layer of polysilicon, said protective mask being essentially a metal silicide, and the step of subjecting said layer of polysilicon to an oxidation treatment whereby said layer of polysilicon is oxidized to form a silicon dioxide layer except at portions thereof underlying said patterned protective mask.

8. The method of claim 7 in which said unpatterned layer of polysilicon is doped with an impurity dopant whereby said silicon dioxide layer is a doped silicon dioxide layer, and further including the step of treating said doped silicon dioxide layer with an etchant which preferentially attacks said doped silicon dioxide layer whereby said layer of doped silicon dioxide is removed, thereby leaving substantially intact said thick, thin, and sidewall portions of the oxide layer.

9. A method of forming metallized electrodes for a semiconductor integrated circuit, said circuit comprising a silicon body coated by relatively thick insulating regions and relatively thin insulating regions, and sidewall insulating regions located at the boundaries between said thick and thin insulating regions, comprising the steps of:

(a) forming an unpatterned polysilicon layer over said insulating thick, thin, and sidewall insulating regions;

(b) forming a patterned resist layer on said unpatterned polysilicon layer whereby complementary portions of the surface of said polysilicon layer remain exposed;

(c) depositing a metal silicide layer over said resist layer and over said exposed complementary portions of the surface of said polysilicon layer;

(d) removing said resist layer whereby metal silicide thereover is lifted off, thereby leaving intact a complementary patterned metal silicide layer of said complementary portions of surfaces of the polysilicon layer; and (e) subjecting said polysilicon layer to a thermal oxidizing treatment whereby the portions of said polysilicon layer not underlying said metal silicide is oxidized to form a patterned layer of silicon dioxide.

10. The method of claim 9 in which said unpatterned polysilicon layer is doped with an impurity dopant, whereby said patterned layer of silicon dioxide is doped silicon dioxide.

11. The method of claim 10 in which said impurity dopant is phosphorus.

12. The method of claim 11 in which said thin insulating region is essentially undoped silicon dioxide, and further comprising, after the step (e), the step of subjecting said doped silicon dioxide layer to an etchant which preferentially attacks with a faster etch rate said doped silicon dioxide than said undoped silicon dioxide, whereby said doped silicon dioxide is removed, thereby leaving intact said metal silicide on said complementary surfaces and leaving intact said thick, thin, and sidewall insulating regions.

13. The method of claim 10 further comprising, after the step (e), the step of subjecting said doped silicon dioxide layer to an etchant which preferentially attacks said doped silicon dioxide whereby said doped silicon dioxide is removed, thereby leaving intact a complementary patterned layer on said metal silicide on said complementary surfaces and leaving intact said thick, thin, and sidewall insulating regions.

14. The method of claim 12 or 13 in which said thick and sidewall insulating regions are essentially undoped silicon dioxide.

15. The method of claim 12 or 13 in which said thermal oxidation treatment oxidizes edge portions of said polysilicon layer underlying said metal silicide, followed by the step of introducing impurities into the silicon body whereby said patterned metal silicide layer serves as a self-alignment protective mask against introducing said impurities.

16. The method of claim 9, 12, or 13 further comprising the step of introducing impurities into the silicon body using said metal silicide on said complementary surfaces as a protective mask against such impurities, whereby source and drain impurity zones are formed in said body in alignment with said metal silicide on said complementary portions.

* * * * *